(12) United States Patent
Mao et al.

(10) Patent No.: US 9,379,819 B1
(45) Date of Patent: Jun. 28, 2016

(54) SYSTEMS AND METHODS FOR REDUCING TEMPERATURE IN AN OPTICAL SIGNAL SOURCE CO-PACKAGED WITH A DRIVER

(71) Applicant: Google Inc., Mountain View, CA (US)

(72) Inventors: Erji Mao, San Jose, CA (US); Hong Liu, Palo Alto, CA (US); Ryohei Urata, San Carlos, CA (US); Melanie Beauchemin, Mountain View, CA (US)

(73) Assignee: Google Inc., Mountain View, CA (US)

( * ) Notice: Subject to any disclaimer, the term of this patent is extended or adjusted under 35 U.S.C. 154(b) by 5 days.

(21) Appl. No.: 14/147,134

(22) Filed: Jan. 3, 2014

(51) Int. Cl.
*H04B 10/00* (2013.01)
*H04B 10/50* (2013.01)
*H04B 10/40* (2013.01)

(52) U.S. Cl.
CPC .............. *H04B 10/501* (2013.01); *H04B 10/40* (2013.01)

(58) Field of Classification Search
CPC ................ H04B 10/40–10/503; H04B 10/506; G02B 6/0085; G02B 6/2856; G02B 6/287; G02B 6/4269; G02B 6/4273
USPC .................................................. 398/135–139
See application file for complete search history.

(56) References Cited

U.S. PATENT DOCUMENTS

| | | | | |
|---|---|---|---|---|
| 4,733,932 A * | 3/1988 | Frenkel et al. | | 385/92 |
| 4,787,696 A * | 11/1988 | Norris et al. | | 385/89 |
| 4,989,930 A * | 2/1991 | Nakagawa et al. | | 385/35 |
| 5,802,222 A * | 9/1998 | Rasch | | G02B 6/12007 348/E9.026 |
| 6,205,274 B1 * | 3/2001 | Zhou | | 385/38 |
| 6,567,439 B1 * | 5/2003 | Auracher et al. | | 372/36 |
| 6,773,532 B2 * | 8/2004 | Wolf et al. | | 156/182 |
| 6,940,723 B2 | 9/2005 | Ice et al. | | |
| 7,206,518 B2 * | 4/2007 | Zhang | | 398/182 |
| 7,412,120 B2 * | 8/2008 | Yamamoto et al. | | 385/14 |
| 7,898,808 B2 | 3/2011 | Joiner et al. | | |
| 8,179,930 B2 * | 5/2012 | Musio et al. | | 372/20 |
| 8,774,568 B2 * | 7/2014 | Han et al. | | 385/14 |
| 2002/0142626 A1 * | 10/2002 | Smeltz, Jr. | | 439/65 |
| 2003/0001081 A1 * | 1/2003 | Kaneko et al. | | 250/216 |
| 2003/0042571 A1 * | 3/2003 | Chen et al. | | 257/531 |
| 2003/0174454 A1 * | 9/2003 | Fu et al. | | 361/103 |
| 2004/0070706 A1 * | 4/2004 | Freeman | | 349/110 |
| 2004/0218850 A1 * | 11/2004 | Peters | | 385/14 |
| 2005/0058408 A1 * | 3/2005 | Colgan et al. | | 385/89 |
| 2005/0067698 A1 * | 3/2005 | Aruga et al. | | 257/737 |
| 2008/0031294 A1 * | 2/2008 | Krishnamoorthy et al. | | 372/34 |
| 2008/0080808 A1 * | 4/2008 | Tolshikhin et al. | | 385/14 |

(Continued)

FOREIGN PATENT DOCUMENTS

JP 3-136303 * 6/1991 .............. H01C 17/06

*Primary Examiner* — Li Liu
(74) *Attorney, Agent, or Firm* — Edward A. Gordon; Foley & Lardner LLP

(57) ABSTRACT

Systems and methods for reducing temperature of an optical signal source co-packaged with a driver are provided. An optical transmitter can include a housing. The optical transmitter can include an optical signal source positioned within the housing. The optical transmitter can include a signal source driver positioned within the housing and configured to control an output of the optical signal source. The optical transmitter can include a substrate mounted on an interior surface of the housing and having a microwave waveguide coupled to it. The microwave waveguide can be configured to direct electrical signals originating outside the housing to the signal source driver. The substrate is can also be configured to limit heat transfer from the signal source driver to the optical signal source.

13 Claims, 11 Drawing Sheets

(56) References Cited

U.S. PATENT DOCUMENTS

| | | | |
|---|---|---|---|
| 2008/0175601 A1* | 7/2008 | Hirai et al. | 398/192 |
| 2008/0285110 A1* | 11/2008 | Terashima et al. | 359/245 |
| 2009/0080831 A1* | 3/2009 | Nakamura | 385/14 |
| 2010/0119231 A1* | 5/2010 | Kim et al. | 398/82 |
| 2010/0177793 A1* | 7/2010 | Rossi et al. | 372/20 |
| 2012/0128375 A1* | 5/2012 | Kimoto et al. | 398/201 |
| 2013/0170783 A1* | 7/2013 | Evans et al. | 385/3 |
| 2013/0195463 A1* | 8/2013 | Byun et al. | 398/91 |
| 2013/0230278 A1* | 9/2013 | Hung et al. | 385/14 |

\* cited by examiner

SYSTEMS AND METHODS FOR REDUCING TEMPERATURE IN AN OPTICAL SIGNAL SOURCE CO-PACKAGED WITH A DRIVER

BACKGROUND

A High speed Ethernet transmitter typically includes an optical transmitter. A directly modulated laser can be used as the optical signal source of the transmitter to provide high optical output power at relatively low cost. To reduce power consumption and to improve high speed electrical signal quality, a laser driver can be packaged inside the transmitter housing, in close proximity to the laser. The laser driver in such a transmitter is generally mounted to a substrate coupled to a microwave waveguide to direct high frequency signals from outside the transmitter housing to the laser driver. The laser driver can heat up during use, and some of this heat can be transferred to the laser due to its close proximity with the laser driver. Such heat transfer results in decreased laser performance.

SUMMARY OF THE INVENTION

Aspects and implementations of the present disclosure are directed to systems and methods for reducing optical signal source temperature in an optical signal source co-packaged with a driver.

At least one aspect is directed to an optical transmitter. The optical transmitter includes a housing. The optical transmitter includes an optical signal source positioned within the housing. The optical transmitter includes a signal source driver positioned within the housing and configured to control an output of the optical signal source. The optical transmitter includes a substrate, mounted on an interior surface of the housing and having a microwave waveguide coupled to it. The microwave waveguide is configured to direct electrical signals originating outside the housing to the signal source driver. The substrate is also configured to limit heat transfer from the signal source driver to the optical signal source.

At least one aspect is directed to an optical transmitter. The optical transmitter includes a signal transmission means for producing an optical signal. The optical transmitter includes a signal driving means for controlling an output of the signal transmission means. The optical transmitter includes a signal conducting means configured to direct electrical signals originating outside the optical transmitter to the signal driving means. The optical transmitter includes a heat conducting means coupled to the signal conducting means and configured to limit heat transfer from the signal driving means to the signal transmission means.

These and other aspects and embodiments are discussed in detail below. The foregoing information and the following detailed description include illustrative examples of various aspects and embodiments, and provide an overview or framework for understanding the nature and character of the claimed aspects and embodiments. The drawings provide illustration and a further understanding of the various aspects and embodiments, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing.

DESCRIPTION OF CERTAIN ILLUSTRATIVE IMPLEMENTATIONS

Following below are more detailed descriptions of various concepts related to, and implementations of, systems and methods for reducing temperature of an optical signal source co-packaged with a driver. The various concepts introduced above and discussed in greater detail below may be implemented in any of numerous ways, as the described concepts are not limited to any particular manner of implementation. Examples of specific implementations and applications are provided primarily for illustrative purposes.

Figure 1:
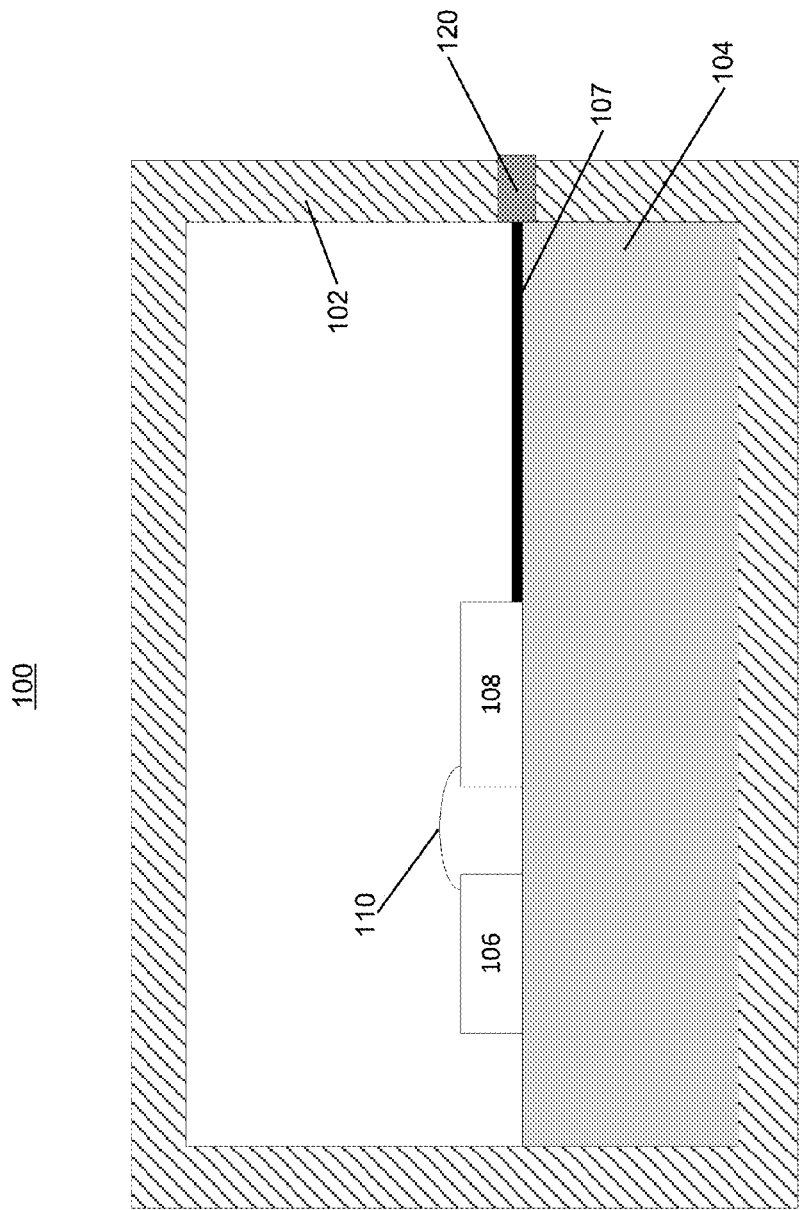
FIG. 1 shows an example optical transmitter.

FIG. 1 shows an example optical transmitter 100. The transmitter 100 includes a housing 102. A substrate 104 is mounted to an interior surface of the housing. A microwave waveguide 107 is coupled to the substrate 104. A feedthrough 120 couples to the microwave waveguide 107. An optical signal source 106 and a signal source driver 108 are mounted on an upper surface of the substrate. The optical signal source 106 and the signal source driver 108 are electrically coupled by a bond wire 110.

The optical transmitter 100 can be used to transmit data, for example, over a fiber optic communication link. Data signals originating outside of the housing 102 can be received by the microwave waveguide 107 via the feedthrough 120 and transmitted to the signal source driver 108. In response, the signal source driver 108 can control the optical signal source 106 to output an optical signal corresponding to the received data by applying an electrical signal to the optical signal source 106 via the bond wire 110. For example, the optical signal source 106 can be a directly modulated laser, and the signal source driver 108 can apply a direct modulation signal to the optical signal source 106 over the bond wire 110. The bond wire 100 can be configured to reliably transmit high frequency electrical signals from the signal source driver 108 to the optical signal source 106. In some implementations, the bond wire 110 is formed from a metal such as gold or copper.

Although FIG. 1 shows only one optical signal source 106 and one signal source driver 108, in some implementations the optical transmitter 100 may include several optical signal sources and signal source drivers. For example, the optical transmitter 100 can include four optical signal sources each capable of outputting data at a rate of 25 Gbps to implement a 100 Gbps Ethernet link using wavelength division multiplexing. Each signal source driver can couple to a respective microwave waveguide. The additional microwave waveguides, optical signal sources, and signal source drivers can be located within the same housing 102. In other implementations, any number of microwave waveguides 107, optical signal sources 106, and signal source drivers 108 may be included in the optical transmitter 100.

Packaging the signal source driver 108 in close proximity to the optical signal source 106 inside the housing 102 can improve high frequency signal quality relative to a transmitter having a signal source driver located outside of a housing that includes an optical signal source. In some implementations, the optical signal source 106 and the signal source driver 108 are separated by a distance in the range of about 100 microns to about 300 microns. The signal source driver 108 can receive data from outside of the housing 102. In some implementations, data may be generated as a microwave signal. The feedthrough 120 can receive the microwave data signal from outside of the housing 102, and the microwave waveguide 107 can direct the data signal to the signal source driver 108. The substrate 104 to which the microwave waveguide 107 is coupled can be selected to have electrical properties that facilitate transmission of the data signal to the signal source driver 108. In some implementations, the substrate 104 can have a dissipation factor of less than about 0.01. As shown in FIG. 1, the signal source driver 108 can be configured to receive the data signal directly from the microwave waveguide 107. In other implementations, a second bond wire can be provided between the microwave waveguide 107 and the signal source driver 108. The second bond wire can transmit the data signal from the microwave waveguide 107 to the signal source driver 108.

In some implementations, the signal source driver 108 may dissipate a relatively large amount of electrical power, causing it to generate substantial heat. Because of their close proximity, heat from the signal source driver 108 can be transferred to the optical signal source 106. The performance of the optical signal source 106 (e.g., its modulation speed and output power) may be diminished as a result of its increased temperature. To limit the heat transfer between the signal source driver 108 and the optical signal source 106, the substrate 104 can be formed from a material having a relatively high thermal conductivity. A high thermal conductivity can help to dissipate the heat away from the signal source driver 108 and the optical signal source 110. The heat can be directed towards the housing 102, which can act as a heat sink. In some implementations, the substrate 104 can have a thermal conductivity greater than about 120 watts per meter kelvin. In some implementations, the substrate 104 can be formed from a ceramic material having high thermal conductivity and suitable electrical properties for transmitting the microwave data signal to the optical signal source 108. For example, the substrate 104 can be formed from aluminum nitride. The housing 102 can also be designed to dissipate heat. In some implementations, the housing 102 is formed from a metal or another material having a high thermal conductivity.

Figure 2A:
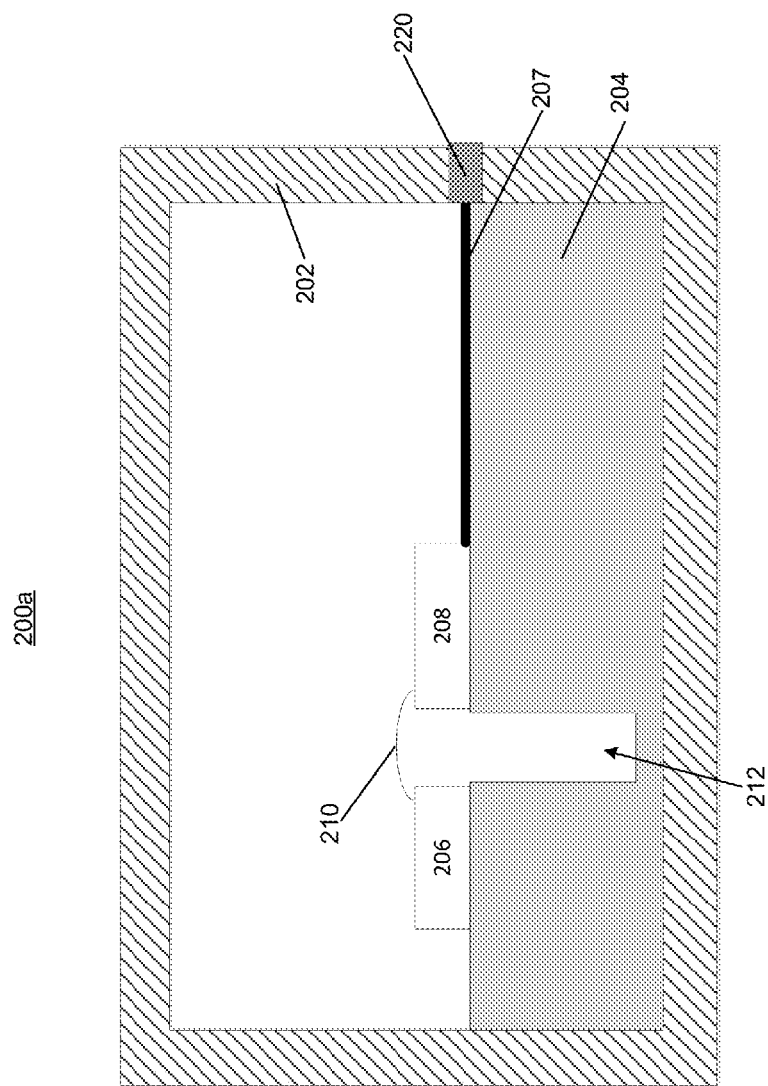
FIGS. 2A-2C show several example optical transmitters having optical signal sources and signal source drivers separated by trenches.
Figure 2B:
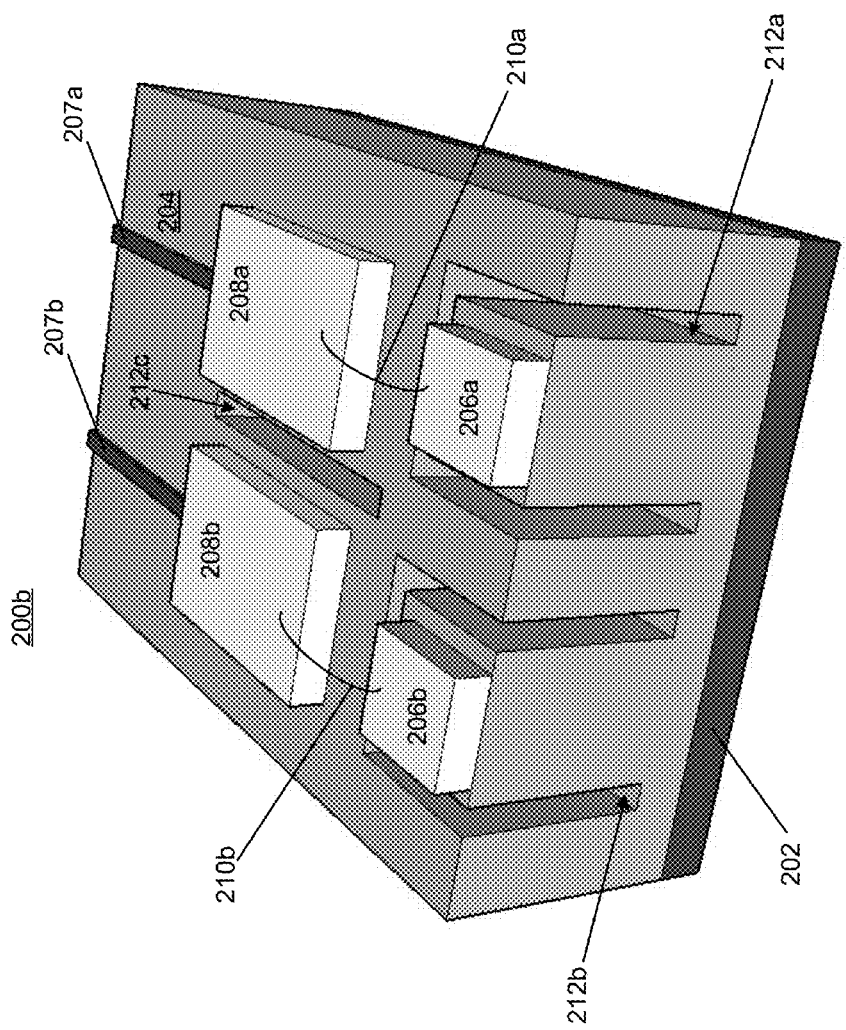
Figure 2C:
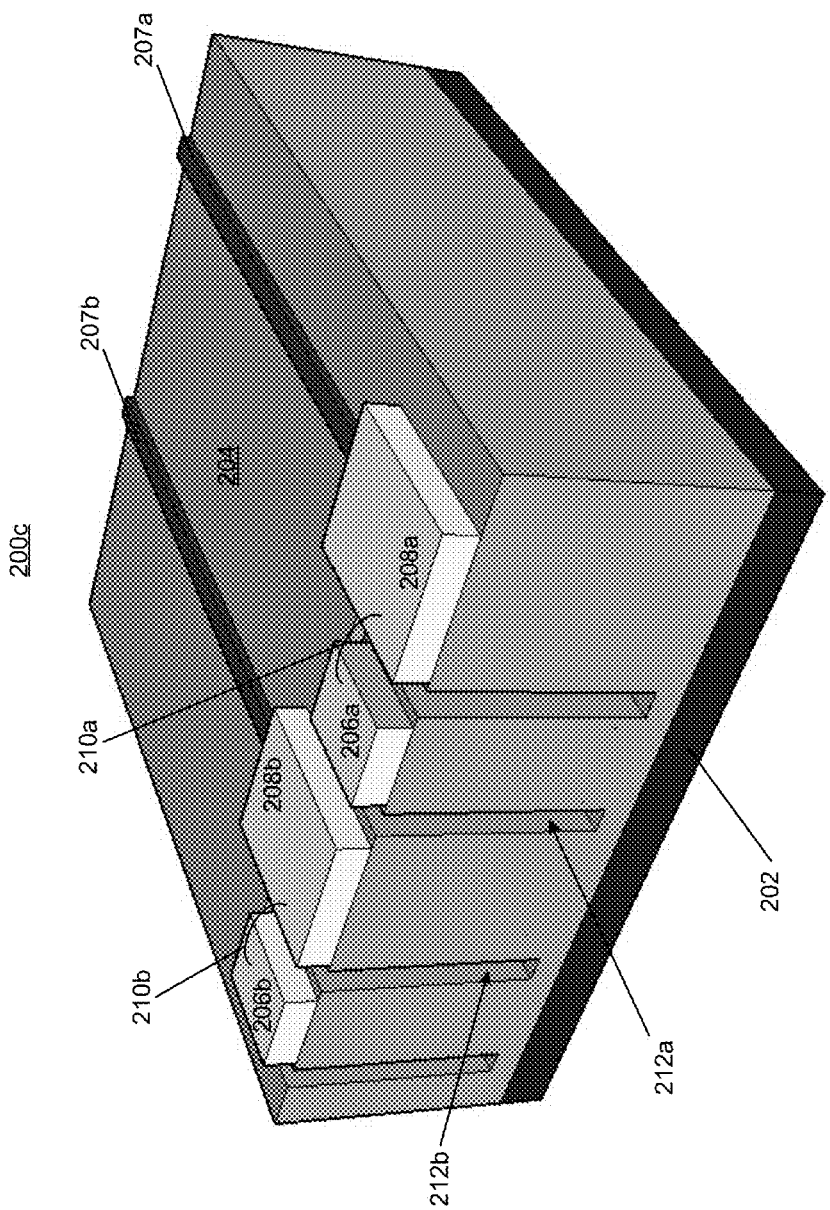

FIGS. 2A-2C show several example optical transmitters having optical signal sources and signal source drivers separated by trenches. FIG. 2A shows a cross-sectional view of an optical transmitter 200a. The optical transmitter 200a includes a housing 202. A substrate 204 is mounted to an interior surface of the housing 202. A microwave waveguide 207 is coupled to the substrate 204. The microwave waveguide 207 couples to a feedthrough 220. An optical signal source 206 and a signal source driver 208 are mounted to the substrate 204 and electrically coupled by a bond wire 210.

To limit the heat exchanged from the signal source driver 208 to the optical signal source 206, the substrate 204 includes a trench 212. The trench 212 is positioned between the optical signal source 206 and the signal source driver 208. The most direct path for heat to flow from the signal source driver 208 to the optical signal source 206 is through the portion of the substrate 204 positioned directly beneath them. Placing a trench in this path removes some of the heat-conducting substrate material, thereby reducing heat transfer.

In some implementations, the housing 202 is filled with a material having a thermal conductivity less than the thermal conductivity of the substrate 204. Therefore, heat is not transferred across the trench 212 as easily as through the material of the substrate 204. The trench 212 can have a depth in the range, for example, of about 200 microns to about 500 microns. In some implementations, the trench 212 extends through the substrate 204 to the housing 202. The trench 212 can have a width substantially equal to the separation distance between the optical signal source 206 and the signal source driver 208. That is, the optical signal source 206 and the signal source driver 208 can be mounted on opposite edges of the trench 212. This arrangement minimizes the separation distance between the optical signal source 206 and the signal source driver 208 for a given width of the trench 212. In some implementations, the trench 212 is formed by etching the substrate 204 to the desired depth.

As described above in connection with FIG. 1, heat transfer from the signal source driver 208 to the optical signal source 206 can be reduced by selecting a material with a high thermal conductivity for the substrate 204. However, in some implementations, the electrical properties required for transmission of the data signal may not be possible in a high thermal conductivity material. The trench 212 can help to reduce heat transfer when more thermally conductive materials are not suitable due to their electrical properties. The relative sizes and positions of the optical signal source 206 and the signal source driver 208 are illustrative only. Other arrangements are possible, as discussed further below. In some implementations, the optical transmitter 200a can include any number of optical signal sources, signal source drivers, microwave waveguides 207, and trenches.

FIG. 2B shows a perspective view of an optical transmitter 200b, as seen from within the housing 202. The optical transmitter 200b includes two optical signal sources 206a and 206b (generally referred to as optical signal sources 206) coupled to respective signal source drivers 208a and 208b (generally referred to as signal source drivers 208) by respective bond wires 210a and 210b. The optical signal sources 206 are positioned along an edge of the optical transmitter 200b to allow their optical output signals to direct light out of the optical transmitter 200b without being obstructed by the housing 202. The signal source drivers 208 are positioned behind the optical signal sources 206. Microwave waveguides 207a and 207b (generally referred to as microwave waveguides 207) for transmitting data signals received from outside of the optical transmitter 200b to the signal source drivers 208 can be coupled to the substrate 204. In some implementations, the microwave waveguides can be formed on the substrate 204 through an etching process. For example, a layer of conductive material can be deposited onto the substrate 204 and can then be etched to form the microwave waveguides 207.

The optical signal sources 206 are surrounded by trenches 212a and 212b. The optical signal sources are therefore substantially thermally isolated from the signal source drivers 208. To reduce heat transfer between the signal source drivers 208, a third trench 212c is placed between them. The trenches 212a-212c can have characteristics similar to those of the trench 212 shown in FIG. 2A. For example, the trenches 212a-212c can have depths in the range of about 200 microns to about 500 microns and widths in the range of about 100 microns to about 150 microns.

FIG. 2C shows a perspective view of an alternative arrangement for the optical transmitter 200c. The optical signal sources 206 are positioned at the edge of the optical transmitter 200c and surrounded by trenches 212a and 212b, similar to the arrangement shown in FIG. 2B. The signal source drivers 208 are positioned beside the respective optical signal sources 206. This configuration increases the distance between the signal source drivers 208, which eliminates the need for an additional trench between the signal source drivers 208. Instead, the increased distance alone is sufficient to reduce heat transfer between the signal source drivers 208.

Figure 3A:
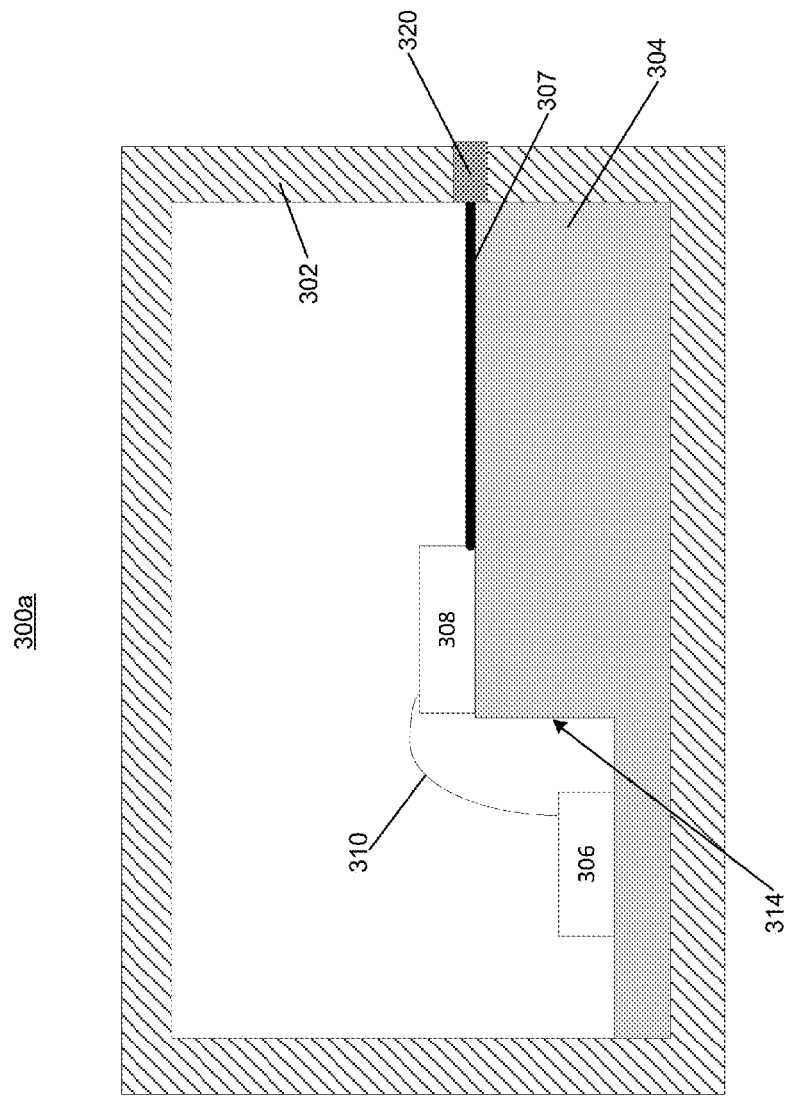
FIGS. 3A-3D show several example optical transmitters having optical signal sources and signal source drivers mounted at different heights within the transmitters.
Figure 3B:
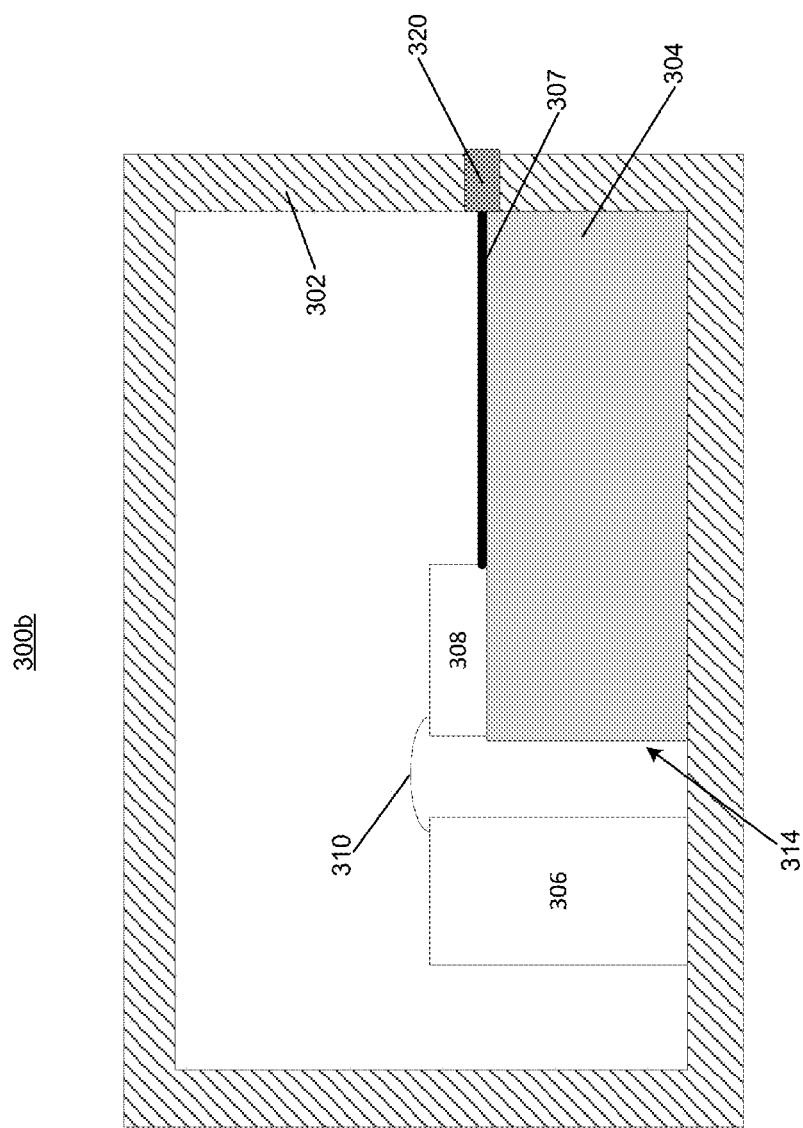

FIGS. 3A-3D show several example optical transmitters having optical signal sources and signal source drivers mounted at different heights. FIG. 3A shows a cross-sectional view of an optical transmitter 300a. The optical transmitter 300a includes a housing 302. A substrate 304 is mounted to an interior surface of the housing 302. A microwave waveguide 307 is coupled to the substrate 304. The microwave waveguide 307 couples to a feedthrough 320. An optical signal source 306 and a signal source driver 308 are mounted to the substrate 304 and electrically coupled by a bond wire 310.

To limit the heat exchanged from the signal source driver 308 to the optical signal source 306, the substrate 304 includes a physical step 314. The step 314 defines two surfaces at different heights of the substrate 304. The optical signal source 306 is mounted at a lower height on the left side of the step 314, and the signal source driver 308 is mounted at a higher height on the right side of the step 314. The most direct path for heat to flow from the signal source driver 308 to the optical signal source 306 is through the portion of the substrate 304 positioned directly beneath them. The step 314 is positioned in this path between the optical signal source 306 and the signal source driver 308, thereby reducing heat transfer between them.

In some implementations, the signal source driver 308 is positioned on the higher side of the step 314. In some other implementations, the optical signal source 306 can be positioned on the higher side of the step 314 and the signal source driver 308 can be placed on the lower side of the step 314.

The step 314 can have a height in the range of about 200 microns to about 500 microns. In some implementations, the step 314 extends to the housing 302 and the optical signal source 306 is mounted directly on the housing, as shown in the optical transmitter 300b depicted in FIG. 3B. The optical signal source 306 and the signal source driver 308 can be mounted on opposite sides of the step 314. This arrangement minimizes the separation distance between the optical signal source 306 and the signal source driver 308 while still placing them at different heights on the substrate 304 to reduce heat transfer. In some implementations, the step 314 is formed by etching the substrate 304 to the desired depth.

Figure 3C:
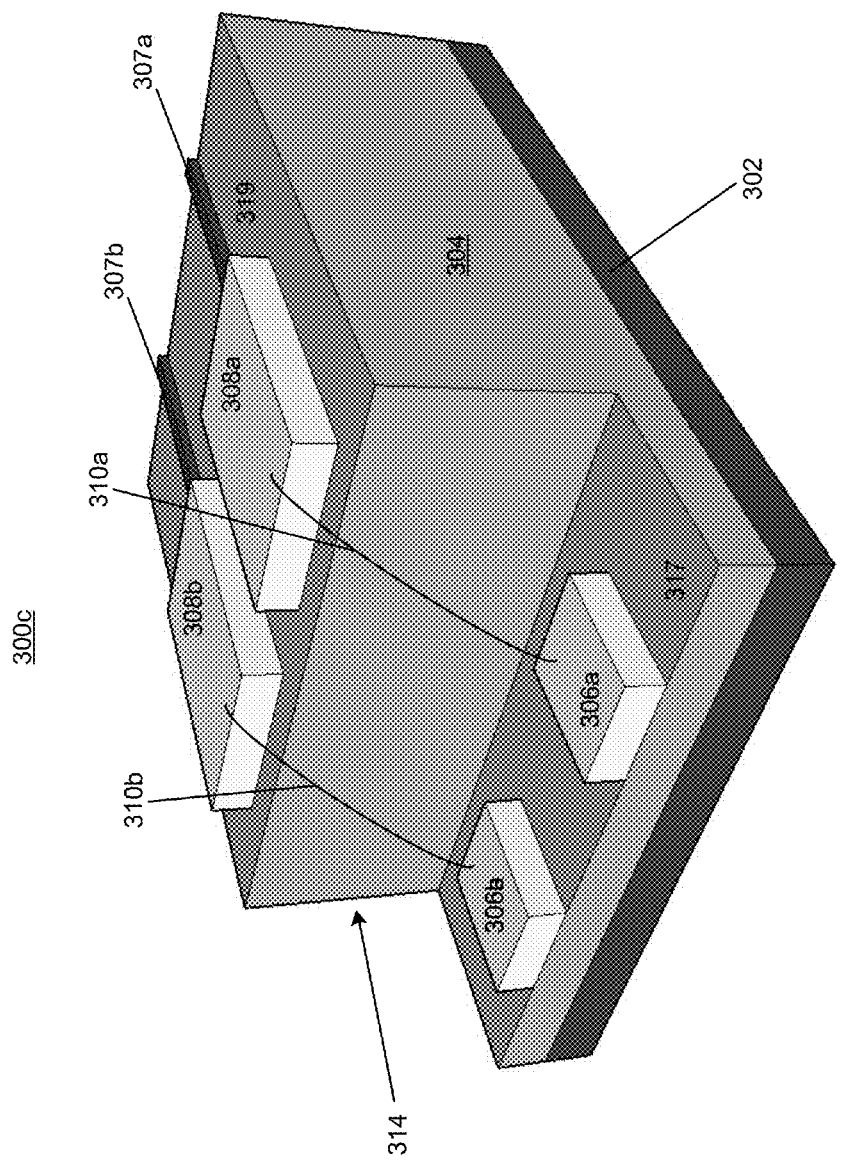

FIG. 3C shows a perspective view of an optical transmitter 300c. For illustrative purposes, the upper portion of the housing 302 is not shown in FIG. 3C. The optical transmitter 300c includes two optical signal sources 306a and 306b (generally referred to as optical signal sources 306) coupled to respective signal source drivers 308a and 308b (generally referred to as signal source drivers 308) by respective bond wires 310a and 310b. The optical signal sources 306 are positioned along an edge of the optical transmitter 300c to allow their optical output signals to direct light out of the optical transmitter 300c without being obstructed by the housing 302. The signal source drivers 308 are positioned behind the optical signal sources 306. Microwave waveguides 307a and 307b (generally referred to as microwave waveguides 307) are coupled to the substrate 304. In some implementations, a layer of conductive material can be deposited onto the substrate 304 and can then be etched to form the microwave waveguides 307.

A step 314 defines two surfaces 317 and 310 of the substrate 304 at different heights. The optical signal sources 306 are positioned on the lower surface 317. The signal source drivers 308 are positioned on the higher surface 319. The optical signal sources 306 and signal source drivers 308 can therefore remain in close proximity to improve high frequency performance, while also limiting heat transfer from the signal source drivers 308 to the optical signal sources 306.

Figure 3D:
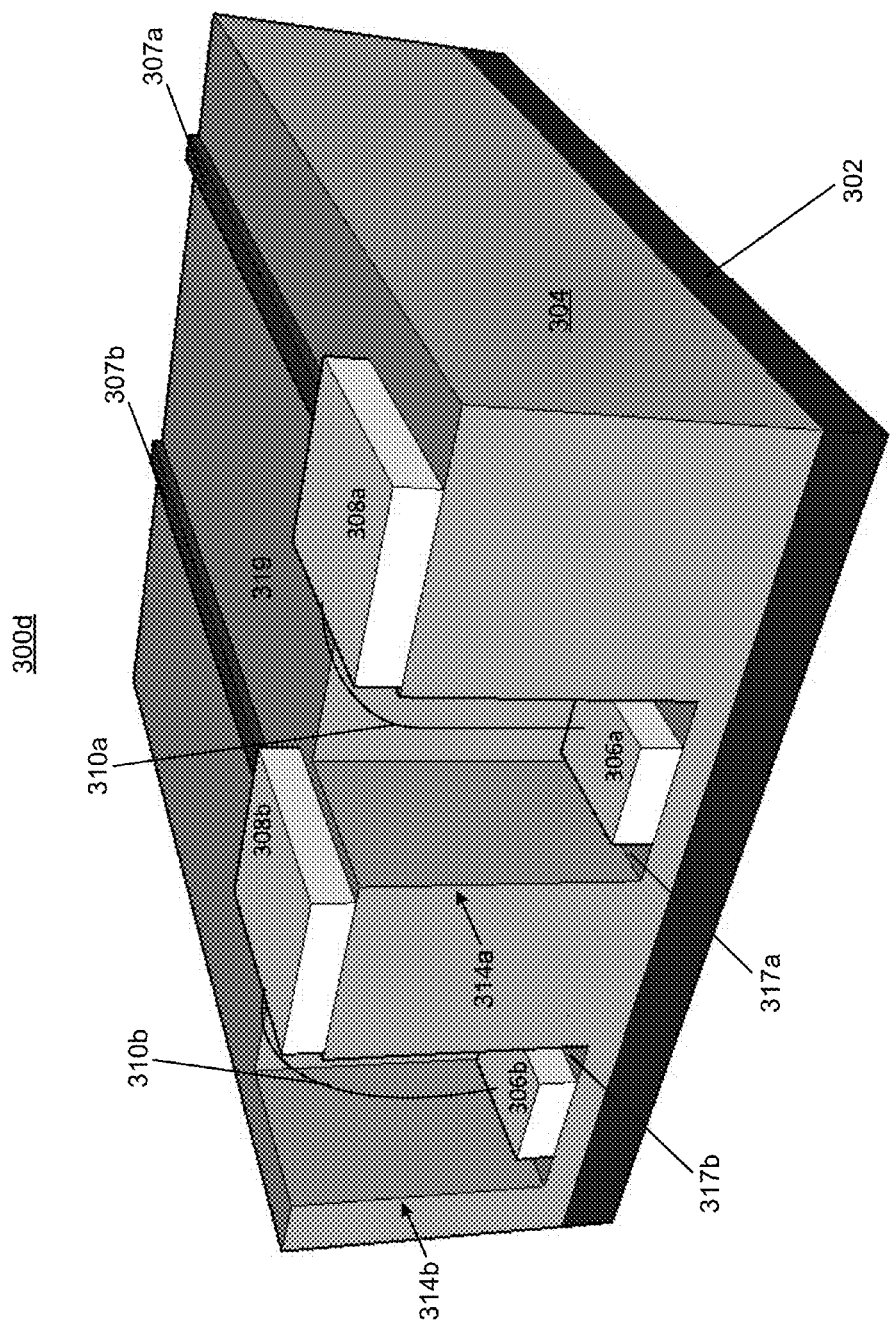

FIG. 3D shows a perspective view of an alternative arrangement for the optical transmitter 300d. The optical signal sources 306 are positioned at the edge of the optical transmitter 300d on a low surfaces 317a and 317b of the substrate 304. The optical signal sources 306 are surrounded by respective steps 314a and 314b, which separate the lower surfaces 317a and 317b of the substrate 304 from an upper surface 319. The signal source drivers 308 are positioned on the upper surface 319 on opposite sides of their respective optical signal sources 306. This configuration increases the distance between the signal source drivers 308, which reduces heat transfer between them.

Figure 4A:
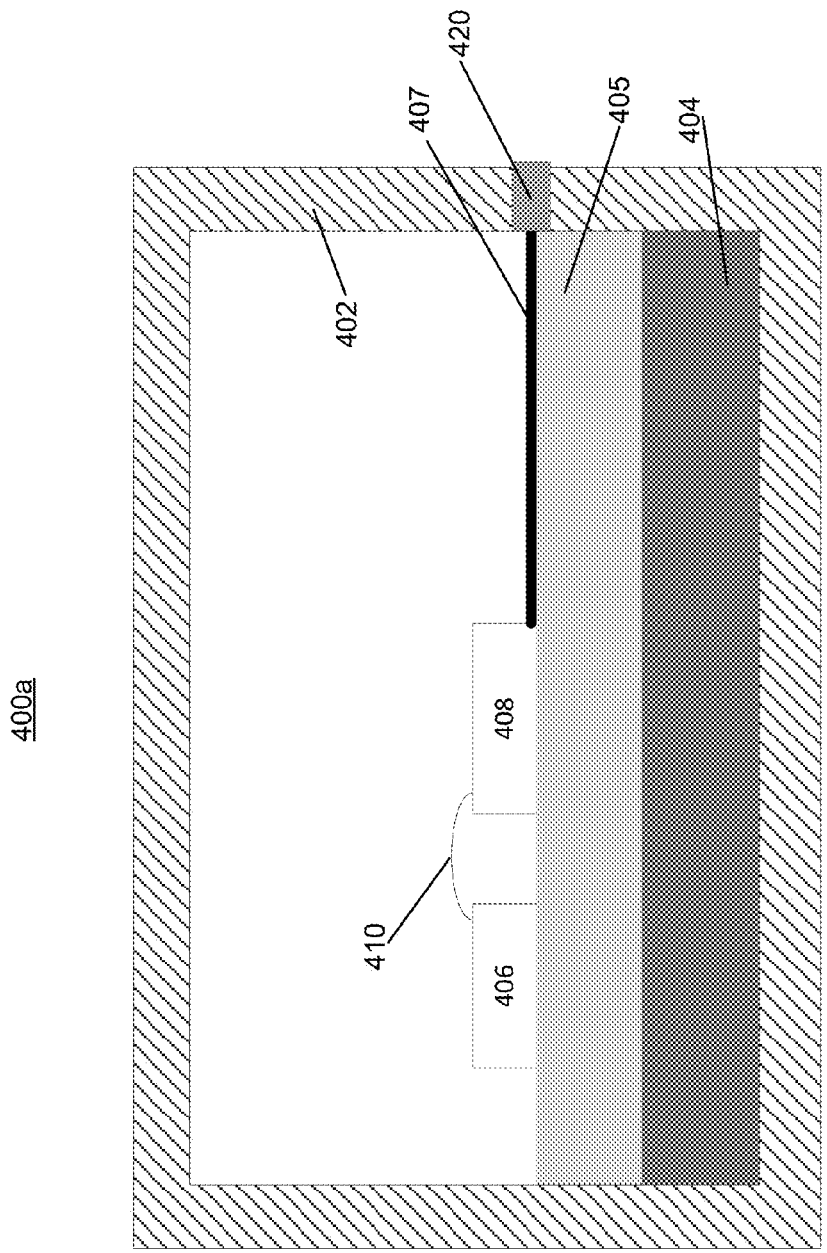
FIGS. 4A-4C show several example optical transmitters each incorporating two substrates having different electrical and thermal properties.
Figure 4B:
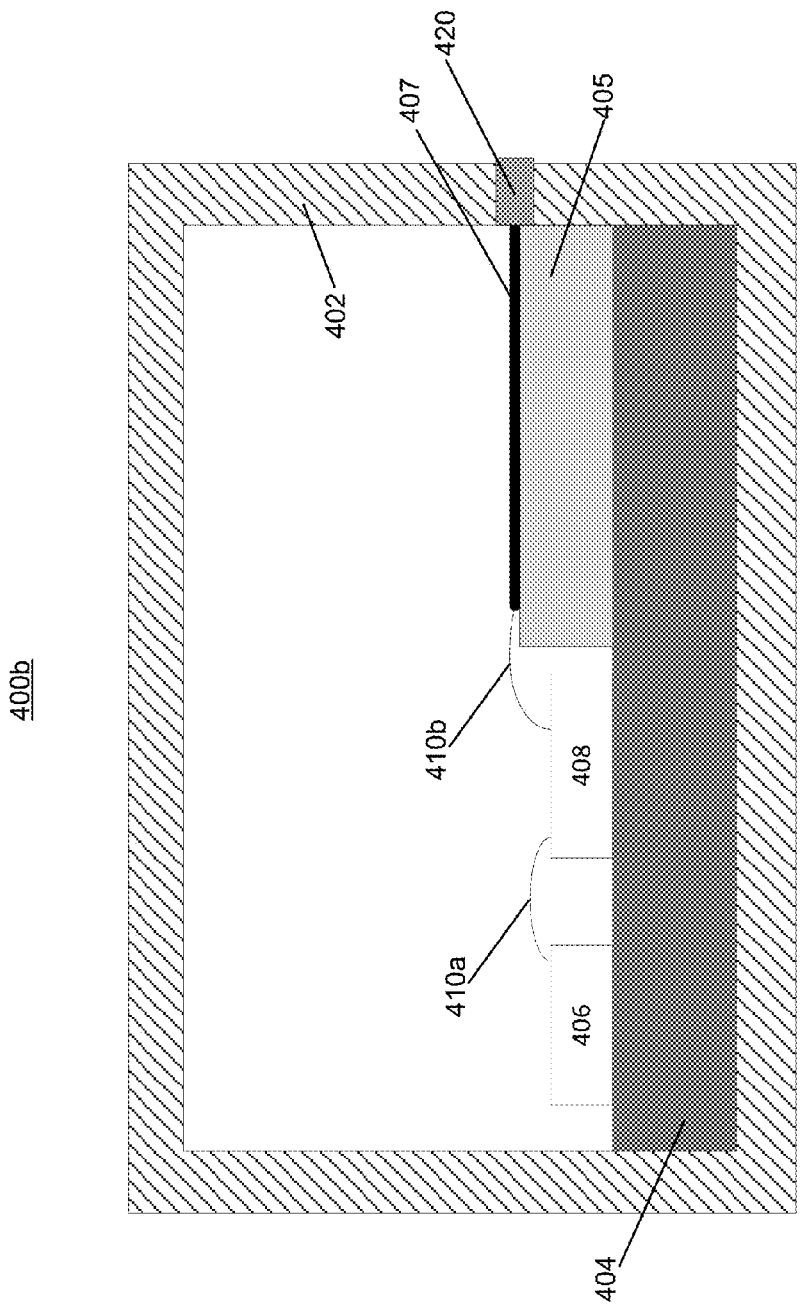
Figure 4C:
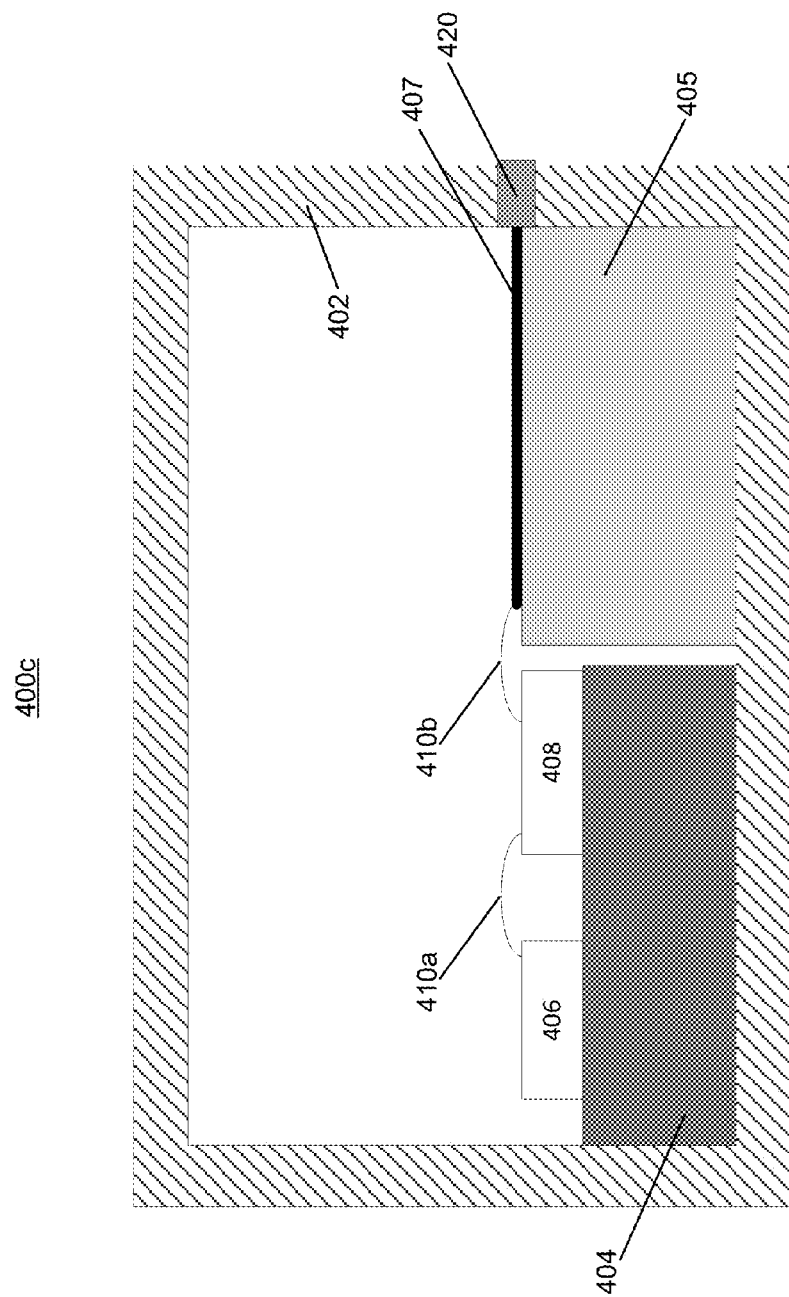

FIGS. 4A-4C show several example optical transmitters each incorporating two substrates having different electrical and thermal properties. FIG. 4A shows a cross-sectional view of an optical transmitter 400a. The optical transmitter 400a includes a housing 402. A thermal conductance substrate 404 is mounted to an interior surface of the housing 402. A waveguide substrate 405 is mounted to the upper surface of the thermal conductance substrate 404. A microwave waveguide 407 is coupled to the waveguide substrate 405 and to a feedthrough 420. An optical signal source 406 and a signal source driver 408 are mounted to the waveguide substrate 405 and electrically coupled by a bond wire 410.

As discussed above, microwave waveguide 407 can receive microwave data signals from the feedthrough 420 and direct the signals to the signal source driver 408. The signal source driver 408 can then communicate with the optical signal source 406 to modulate its output via the bond wire 410. The material used to form the waveguide substrate 405, on which the microwave waveguide 407 is deposited, can be selected primarily based on its electrical properties. However, heat transfer from the signal source driver 408 to the optical signal source 406 can interfere with the performance of the optical signal source 406.

The thermal conductance substrate 404 can be used to reduce heat transfer to the optical signal source 406. For example, the material used to form the thermal conductance substrate 404 can be selected primarily based on its thermal characteristics. To draw heat away from the optical signal source 406, the thermal conductance substrate 404 can be chosen to have a relatively high thermal conductivity. Because the microwave waveguide 407 is deposited on the waveguide substrate 405, which can be designed to have suitable electrical properties to carry the microwave data signal, the electrical properties of the thermal conductance substrate 404 can safely be ignored.

During operation of the optical transmitter 400a, the signal source driver 408 generates heat that is absorbed by the waveguide substrate 405. The thermal conductance substrate 404 is in contact with the waveguide substrate 405 so that an interface between the two substrates is formed. The high thermal conductivity of the thermal conductance substrate 404, combined with its large interface with the waveguide substrate 405, tends to draw heat away from the waveguide substrate 405, thereby limiting the temperature increase of the optical signal source 406.

The relative sizes of the substrates 404 and 405 shown in FIG. 4A are illustrative only. In some implementations, the waveguide substrate 405 may be significantly thicker than the waveguide substrate 404. In other implementations, the thermal conductance substrate 404 may be significantly thicker than the waveguide substrate 405. For example, for applications in which thermal stability of the optical signal source 406 is more important, the thermal conductance substrate 404 may be made larger than the waveguide substrate 405 in order to more efficiently direct heat away from the optical signal source 406.

FIG. 4B shows an alternative optical transmitter 400b. The optical transmitter 400b includes a housing 402. A thermal conductance substrate 404 is mounted to an interior surface of the housing 402. A waveguide substrate 405 is mounted to the upper surface of the thermal conductance substrate 404. A microwave waveguide 407 is coupled to the waveguide substrate 405 and to a feedthrough 420. The waveguide substrate 405 does not extend across the full length of the thermal conductance substrate 404, leaving a portion of the upper surface of the thermal conductance substrate 404 exposed. An optical signal source 406 and a signal source driver 408 are mounted to the exposed surface of the waveguide substrate 404 and are electrically coupled by a bond wire 410a. A second bond wire 410b couples the microwave waveguide 407 to the signal source driver 408.

The waveguide substrate 405 is coupled to the microwave waveguide 407 and can therefore be selected to have a low loss tangent, regardless of its thermal conductivity. The signal source driver 408 is not in contact with the microwave waveguide 407 coupled to the waveguide substrate 405 and as a result cannot receive electrical signals directly from the microwave waveguide 407. Therefore, the bond wire 410b can be used to transmit electrical signals from the microwave waveguide 407 to the optical signal source 408. Heat can be dissipated by the thermal conductance substrate 404, which can be chosen to have a relatively high thermal conductivity so that it functions efficiently as a heat sink. The thermal conductance substrate 404 draws heat away from the waveguide substrate 405 and transfers the heat to the housing 402.

FIG. 4C shows another example optical transmitter 400c. The optical transmitter 400c includes a housing 402. A thermal conductance substrate 404 is mounted to a first portion of the bottom interior surface of the housing 402. A waveguide substrate 405 is mounted to a second portion of the bottom interior surface of the housing 402. A microwave waveguide 407 is coupled to the waveguide substrate 405 and to a feedthrough 420. The waveguide substrate 405 and the thermal conductance substrate 404 are separated be a narrow gap. An optical signal source 406 and a signal source driver 408 are mounted to the upper surface of the thermal conductance substrate 404 and electrically coupled by a bond wire 410a. A second bond wire 410b couples the microwave waveguide 407 to the signal source driver 408.

The waveguide substrate 405 is coupled to the microwave waveguide 407 and can therefore be selected to have a low loss tangent, regardless of its thermal conductivity. The signal source driver 408 is not in contact with the microwave waveguide 407 and therefore the bond wire 410b can be used to transmit electrical signals from the microwave waveguide 407 to the optical signal source 408. The thermal conductance substrate 404 serves as a heat sink to draw heat generated by the signal source driver 408 away from the optical signal source 406 and towards the housing 402. In some implementations, the thermal conductance substrate 404 can also include a trench or step, similar to the features discussed above in connection with FIGS. 2A-2C and 3A-3D, to further limit heat transfer between the signal source driver 408 and the optical signal source 406.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An optical transmitter, comprising:
   a housing;
   a first optical signal source positioned within the housing;
   a first signal source driver positioned within the housing and configured to control an output of the first optical signal source;
   a second optical signal source positioned within the housing;
   a second signal source driver positioned within the housing; and
   a substrate, mounted on an interior surface of the housing and having a microwave waveguide coupled thereto configured to direct electrical signals originating outside the housing to the first and second signal source drivers, wherein the substrate is further configured to limit heat transfer from the first and second signal source drivers to the first and second optical signal sources,
   wherein the first optical signal source and the first signal source driver are separated by a distance in the range of about 100 microns to about 300 microns,
   wherein the second optical signal source and the second signal source driver are separated by a distance in the range of about 100 microns to about 300 microns,
   wherein the first optical signal source is positioned along an edge of the optical transmitter and surrounded on at least three sides by a first trench in the substrate,
   wherein the second optical signal source is positioned along an edge of the optical transmitter and surrounded on at least three sides by a second trench in the substrate,
   wherein the first trench and second trench have respective depths smaller than a thickness of the substrate.

2. The optical transmitter of claim 1, wherein the substrate has an electrical dissipation factor of less than about 0.01.

3. The optical transmitter of claim 1, wherein the substrate is formed from aluminum nitride.

4. The optical transmitter of claim 1, further comprising a bond wire communicatively coupling the first optical signal source to the first signal source driver.

5. The optical transmitter of claim 1, wherein the first optical signal source and the first signal source driver are mounted to the substrate.

6. The optical transmitter of claim 5, wherein the substrate comprises a material having a thermal conductivity greater than about 120 watts per meter kelvin.

7. The optical transmitter of claim 5, wherein the first trench extends from a top surface of the substrate and is positioned between the first optical signal source and the first signal source driver.

8. The optical transmitter of claim 7, wherein the first trench extends to a depth in the range of about 200 microns to about 1000 microns.

9. The optical transmitter of claim 7, wherein the first trench has a width substantially equal to the distance by which the first optical signal source is separated from the first signal source driver.

10. The optical transmitter of claim 1, wherein:
the first signal source driver is positioned along the edge of the optical transmitter beside the first optical signal source, and
the second signal source driver is positioned along the edge of the optical transmitter beside the second optical signal source and configured to control an output of the second optical signal source.

11. An optical transmitter, comprising:
a first signal transmission means for producing an optical signal;
a first signal driving means for controlling an output of the first signal transmission means;
a second signal transmission means for producing an optical signal;
a second signal driving means;
a signal conducting means configured to direct electrical signals originating outside the optical transmitter to the first signal driving means and the second signal driving means; and
a heat conducting means coupled to the signal conducting means and configured to limit heat transfer from the first signal driving means and the second signal driving means to the first signal transmission means and the second signal transmission means,
wherein the first signal transmission means and the first signal driving means are separated by a distance in the range of about 100 microns to about 300 microns,
wherein the second signal transmission means and the second signal driving means are separated by a distance in the range of about 100 microns to about 300 microns,
wherein the first signal transmission means is positioned along an edge of the optical transmitter and surrounded on at least three sides by a first trench in the heat conducting means,
wherein the second signal transmission means is positioned along an edge of the optical transmitter and surrounded on at least three sides by a second trench in the heat conducting means,
wherein the first trench and second trench have respective depths smaller than a thickness of the heat conducting means.

12. The optical transmitter of claim 11, wherein the first signal transmission means and the first signal driving means are mounted on the heat conducting means.

13. The optical transmitter of claim 12, wherein the first trench extends from a top surface of the heat conducting means and is positioned between the first signal transmission means and the first signal driving means.

* * * * *